(12) United States Patent
Kaliher

(10) Patent No.: US 7,733,333 B2
(45) Date of Patent: Jun. 8, 2010

(54) SHARED ELECTRODE PATTERN FIELD EFFECT SENSOR AND JOYSTICK THEREWITH

(75) Inventor: Paul L. Kaliher, Naperville, IL (US)

(73) Assignee: TouchSensor Technologies, LLC, Wheaton, IL (US)

( * ) Notice: Subject to any disclaimer, the term of this patent is extended or adjusted under 35 U.S.C. 154(b) by 962 days.

(21) Appl. No.: 11/315,839

(22) Filed: Dec. 22, 2005

(65) Prior Publication Data

US 2006/0202971 A1    Sep. 14, 2006

Related U.S. Application Data

(60) Provisional application No. 60/638,200, filed on Dec. 23, 2004, provisional application No. 60/638,197, filed on Dec. 23, 2004.

(51) Int. Cl.
G09G 5/00    (2006.01)

(52) U.S. Cl. ..................... 345/173; 178/18.06

(58) Field of Classification Search .................. 345/157, 345/160, 161, 173, 174, 175, 178; 178/18.03–18.07
See application file for complete search history.

(56) References Cited

U.S. PATENT DOCUMENTS

| | | |
|---|---|---|
| 4,242,676 A | 12/1980 | Piguet et al. |
| 4,290,061 A * | 9/1981 | Serrano ...................... 345/174 |
| 6,320,282 B1 | 11/2001 | Caldwell |
| 7,180,017 B2 * | 2/2007 | Hein .......................... 200/5 R |

FOREIGN PATENT DOCUMENTS

| | | |
|---|---|---|
| DE | 3910977 | 10/1990 |
| GB | 2022264 | 12/1979 |

OTHER PUBLICATIONS

PCT Search Report Dated Jun. 26, 2006.

* cited by examiner

*Primary Examiner*—Richard Hjerpe
*Assistant Examiner*—Tom V Sheng
(74) *Attorney, Agent, or Firm*—Barnes & Thornburg LLP

(57) ABSTRACT

The present invention is directed to a shared electrode pattern field effect touch sensor apparatus. The apparatus includes first and second spaced electrode patterns, each having an inner electrode and an outer electrode. The inner electrode includes a primary portion defining a primary sense area and at least one secondary portion. Secondary portions of at least two patterns are adjacently disposed, and define secondary sense areas. A pulse generation circuit and a detection circuit are electrically coupled to each pattern. The presence of an object proximate a primary sense area activates one detection circuit. The presence of an object proximate a secondary sense area activates two detection circuits. A controller in communication with the detection circuits senses activation of the detection circuits. In a preferred embodiment, the apparatus is a navigational control device. A method of processing touch sensor field effect signals is also disclosed.

46 Claims, 7 Drawing Sheets

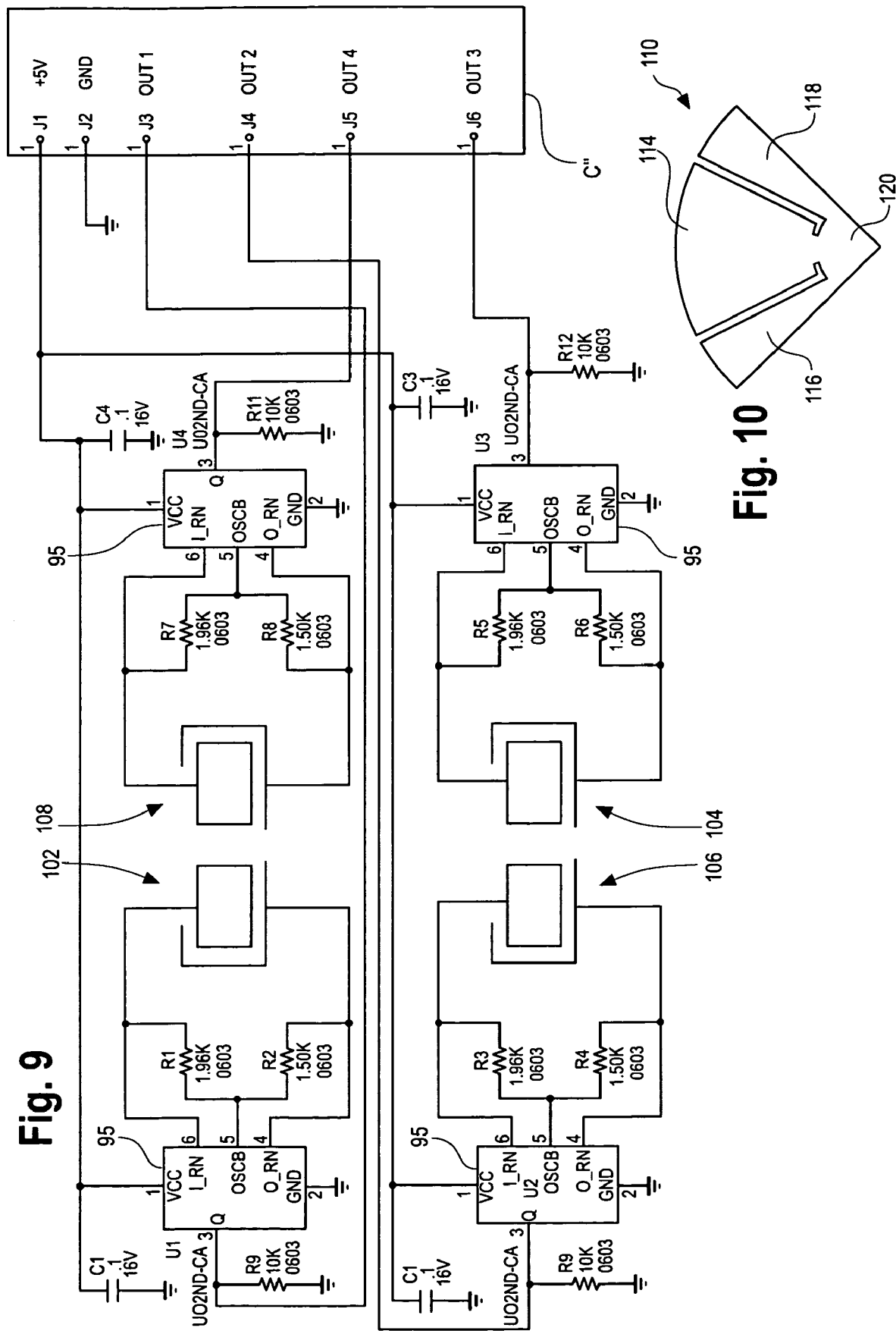

SHARED ELECTRODE PATTERN FIELD EFFECT SENSOR AND JOYSTICK THEREWITH

CROSS REFERENCE TO RELATED APPLICATIONS

This application claims priority from and incorporates by reference the disclosure of U.S. Provisional Patent Application No. 60/638,200, filed Dec. 23, 2004. This application also claims priority from and incorporates by reference the disclosure of U.S. Provisional Patent Application No. 60/638,197, filed Dec. 23, 2004, and U.S. patent application Ser. No. 11/315,719, filed Dec. 22, 2005, both entitled Track Position Sensor and Method.

FIELD OF THE INVENTION

The present invention is directed to field effect touch sensor apparatus using shared electrode patterns.

BACKGROUND OF THE INVENTION

Navigational control devices, such as joysticks for use with computer software, are known in the art. Conventional joysticks may include a housing with a user-positioned actuator handle pivoted about a fixed point to actuate electromechanical switches that generate X- and Y-axis data. In some joysticks, springs may be employed to return the actuator handle to a centered position. Such conventional joysticks typically require some type of opening in the housing through which the actuator handle extends. The opening, as well as openings in the switch itself, can allow dirt, water and other contaminants to enter the housing and become trapped within the switch. Certain environments contain a large volume of contaminants that can pass through the openings, causing electrical shorting or damage to the components. Further, electromechanical switches are subject to wear, mechanical failure, and slow reaction time due to their very nature as mechanical devices having moving parts.

Various alternatives to mechanical switches are known in the art, such as optical encoders, switch arrays, piezo-electric transducers, inductive coupling devices, and magnetic devices. However, the incorporation of such components in a joystick has not proven cost effective for consumer-oriented data input applications. Furthermore, they may unduly restrict actuator motion, thereby degrading user "feel."

Field effect touch sensors have proven particular advantageous for many applications. Such field effect touch sensors are disclosed in U.S. Pat. No. 5,594,222 to Caldwell; U.S. Pat. No. 6,310,611 to Caldwell; and U.S. Pat. No. 6,320,282 to Caldwell, the disclosures of which are incorporated herein by reference. However, known touch sensors use one electrode pattern per sense point. Further, the field effect sensors disclosed in U.S. Pat. No. 6,320,282 also require one integrated control circuit per electrode pattern and, therefore, one integrated control circuit per sense point. As such, these designs may not be cost effective or practical for use with some devices requiring numerous sense points, such as navigational control devices or slide control devices.

There is a need for an apparatus that reduces the number of electrode patterns and integrated control circuits in field effect sensor applications, thereby reducing component cost and manufacturing cost, and improving reliability.

BRIEF DESCRIPTION OF THE DRAWINGS

FIG. 9 is a schematic diagram illustrating the electrical connections among the components on the sensor substrate of the apparatus of FIG. 8; and FIG. 10 is a plan view of an inner electrode according to the fifth embodiment.

DETAILED DESCRIPTION OF THE ILLUSTRATED EMBODIMENTS

Figure 1:
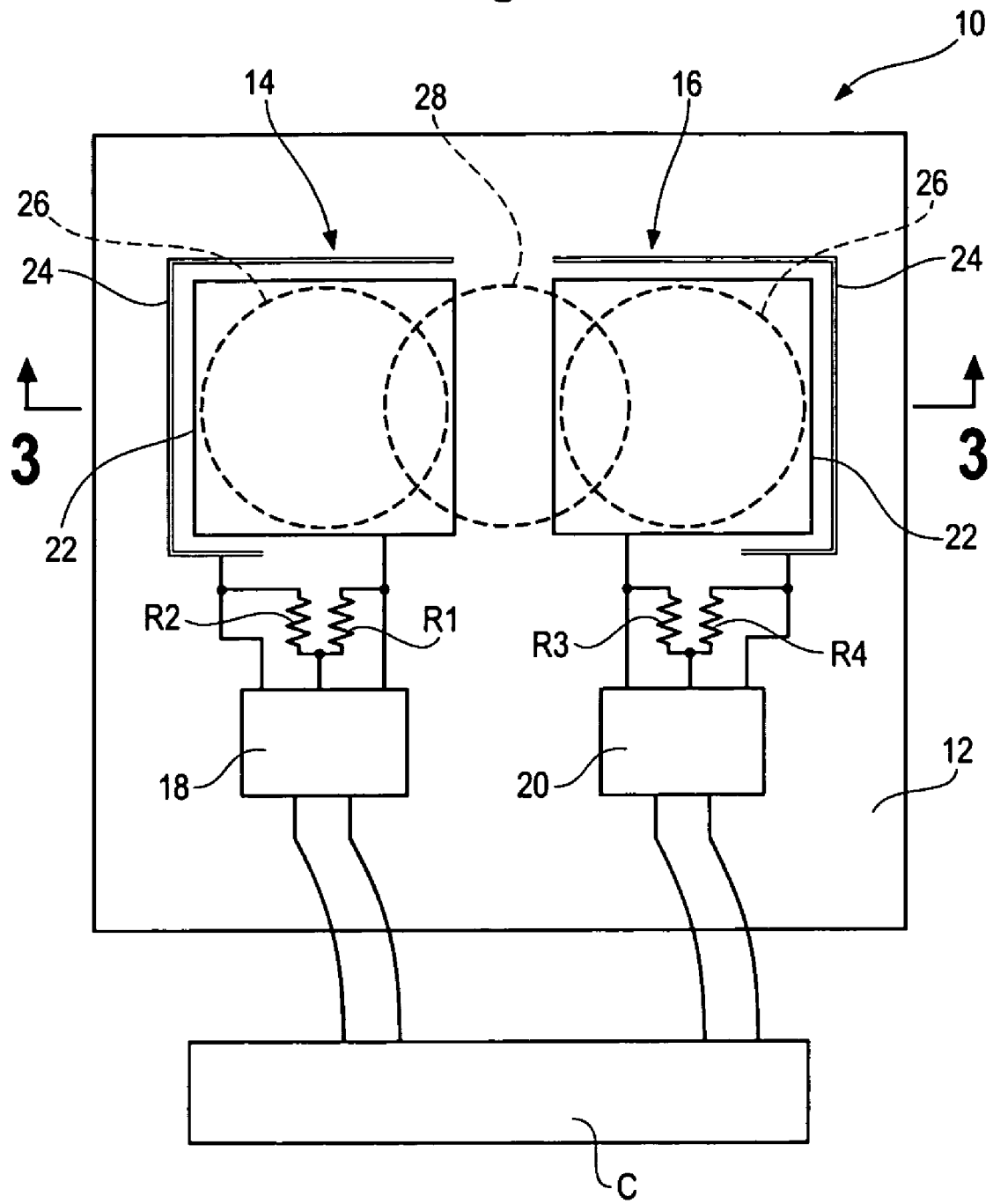
FIG. 1 is a plan view of a shared electrode pattern field effect sensor apparatus according to a first embodiment of the present invention.

FIG. 1 illustrates a first preferred embodiment of a shared electrode pattern field effect sensor apparatus 10 according to the present invention. Apparatus 10 includes first and second conductive electrode patterns 14, 16 disposed on dielectric substrate 12. Each electrode pattern is electrically coupled to a corresponding pulse generation circuit and a corresponding detection circuit. Preferably, the pulse generation and detection circuits are embodied as integrated control circuits 18, 20, which are disposed on substrate 12 near the corresponding electrode patterns 14, 16. A controller C receives output signals from each detection circuit. Controller C can, but need not be, disposed on substrate 12.

Substrate 12 may be formed from glass, plastic, fiberglass reinforced epoxy resin, or some other dielectric substance. Depending on the particular application, substrate 12 may be either rigid or flexible, and may have either a substantially uniform or varying thickness including dimples or depressions. For example, a glass substrate 12 may have a thickness of between about 1.1 mm and about 5 mm. A polymer substrate 12 may have a thickness of less than 1 mm. The thickness of substrate 12 may vary depending on the particular application such that a thicker substrate may be used where additional strength is required. Further, substrate 12 may be manufactured from a flexible material for use in applications where sensor apparatus 10 must conform to a non-planar shape. Preferably, substrate 12 is free of penetrations proximate electrode patterns 14, 16 and corresponding sense areas, as described below, so that contaminants present on one side of substrate 12 do not readily migrate to the other surface of substrate 12.

Each electrode pattern 14, 16 preferably has an inner electrode 22 and an outer electrode 24 partially surrounding inner electrode 22. Each inner electrode 22 defines a primary sense area, as shown by dashed lines 26. A portion of inner electrode 22 of electrode pattern 14 is adjacent a portion of inner electrode 22 of electrode pattern 16. The adjacent portions of inner electrodes 22 of electrode patterns 14, 16 define a secondary sense area, as shown by dashed lines 28. Preferably, outer electrodes 24 do not extend into the region between inner electrodes 22 of adjacent electrode patterns 14, 16. Inner electrodes 22 of electrode patterns 14, 16 are arranged and spaced such that secondary sense area 28 partially overlaps a portion of each primary sense area 26 of adjacent patterns 14, 16.

While inner electrodes 22 are shown in FIG. 1 as being substantially rectangular, and outer electrodes 24 are shown as comprising linear segments, other geometric shapes may be used for inner and outer electrodes 22, 24. The conductive material surface area of inner electrode 22 can, but need not differ from the conductive material surface area of outer electrode 24. Electrodes 22, 24 can be made of any suitable conductive material, for example, copper, indium tin oxide, and other materials as would be recognized by one skilled in the art.

Integrated control circuits 18, 20 preferably are TS-100 ASICs, an integrated circuit available from TouchSensor Technologies, LLC of Wheaton, Ill. The general principles of operation of the TS-100 ASIC are described in U.S. Pat. No. 6,320,282 to Caldwell, the disclosure of which is incorporated herein by reference. The pin-out of integrated circuits 18, 20 as shown in the drawings corresponds to that of the TS-100 ASIC, where the input power (+5 volts) connection is on pin 1, the ground connection is on pin 2, the signal output connection is on pin 3, outer electrode 24 connection is on pin 4, the excitation signal connection is on pin 5, and inner electrode 22 connection is on pin 6.

Figure 2:
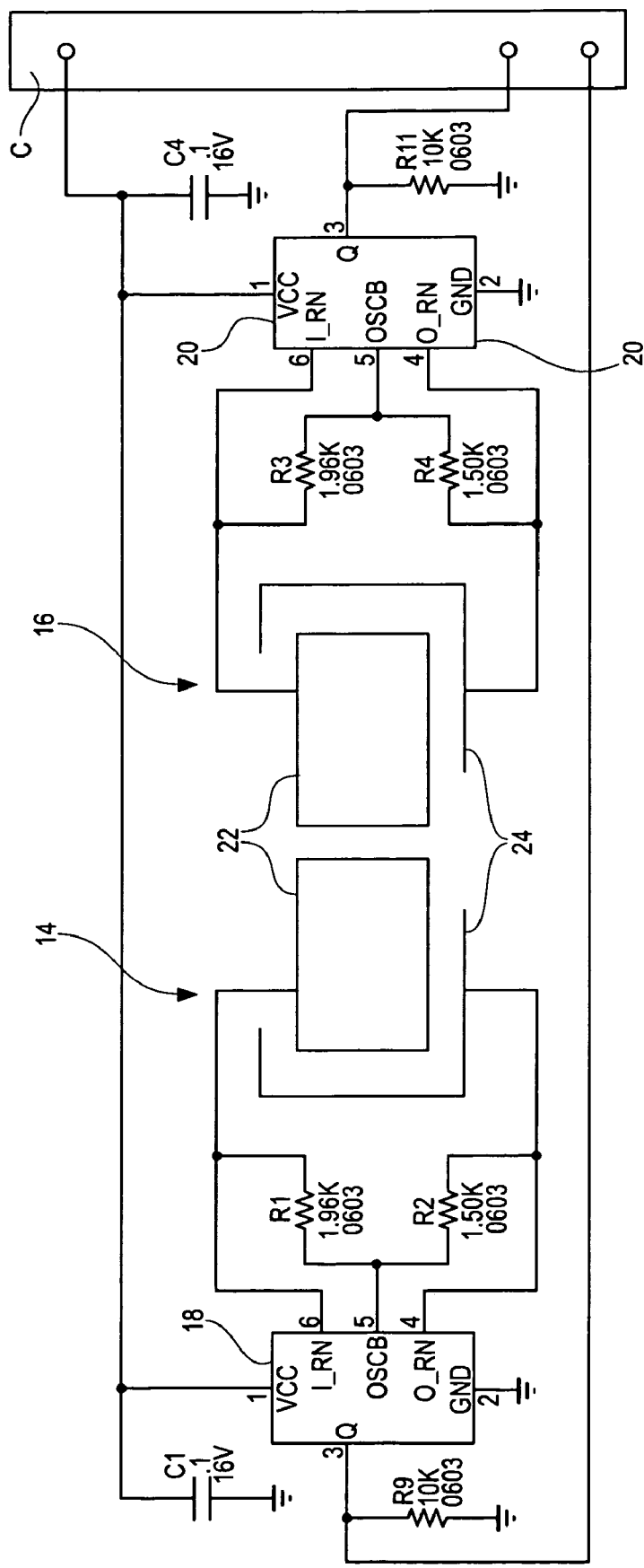
FIG. 2 is a schematic diagram illustrating the electrical connections among the components on the sensor substrate of the apparatus of FIG. 1.

Referring to FIGS. 1 and 2, integrated control circuit 18 preferably is connected to inner and outer electrodes 22, 24 of electrode pattern 14 through resistors R1, R2, respectively. Likewise, integrated control circuit 20 is connected to inner and outer electrodes 22, 24 of electrode pattern 16 through resistors R3, R4, respectively. In the illustrated embodiments, resistors R1-R4 are external to, and connected to, integrated control circuits 18, 20. In other embodiments, resistors R1-R4 can be internally provided within integrated control circuits 18, 20.

In operation, excitation signals are provided to inner and outer electrodes 22, 24 of each electrode pattern 14, 16 from pin 5 of the corresponding integrated control circuit 18, 20. Preferably, an oscillator output pulse train or square wave signal is provided at pin 5 to both inner electrode 22 and outer electrode 24. The oscillator signal may be a square wave oscillating between 0 and +5 volts at a frequency of approximately 32 kHz. Alternatively, the oscillator or strobe signal may have a frequency of up to or greater than 200 kHz, depending on the detection circuitry used. Furthermore, the strobe signal may oscillate between 0 and +3 volts, 0 and +12 volts, 0 and +24 volts, −5 volts and +5 volts, or any other voltage range.

Figure 3:
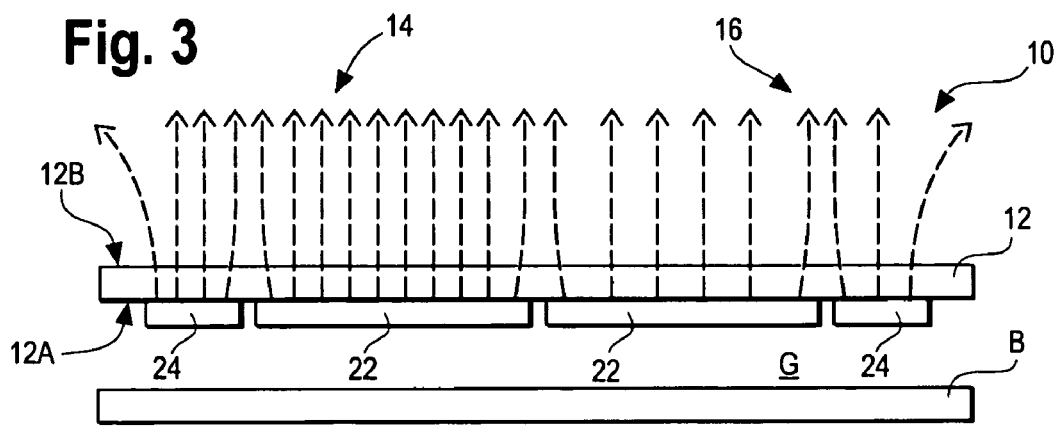
FIG. 3 is a cross-sectional view of the apparatus of FIG. 1 taken along line 3-3 and viewed in the direction of the arrows, with broken lines illustrating electric flux lines.

The excitation signals applied to inner and outer electrodes 22, 24 of each electrode pattern 14, 16 generate electric fields about inner and outer electrodes 22, 24. As shown by the dashed lines in FIG. 3, electric flux lines emanate from inner and outer electrodes 22, 24 and through substrate 12, such that electric fields corresponding to each inner and outer electrode 22, 24 emanate from primary sense areas 26 and secondary sense area 28. Although not shown in the drawings, electric flux lines would also emanate from inner and outer electrodes 18, 20 in the opposite direction, away from (rather than through) substrate 12. However, the electric flux concentration would be greater near the sense areas 26, 28 on the side of substrate 12 opposite the electrode patterns, given that the electric flux concentration is multiplied through dielectric substrates, as would be understood by one skilled in the art. An insulator, such as a potting material, preferably is applied to the electrode pattern side of substrate 12 to shield or dissipate the electric fields emanating away from substrate 12. In other embodiments, an air gap or backing of foam rubber or plastic may be provided. These insulating structures reduce the likelihood of stimuli on the side of substrate 12 opposite sense areas 26, 28 from causing unintended sensor actuation. These insulating structures would be omitted in embodiments where sensing from both sides of the substrate is desired.

Preferably, inner and outer electrodes 22, 24 are charged such that all of the electric fields emanating therefrom have the same polarity. The fields extend outwardly from inner and outer electrodes 22, 24. Field strength is greatest closer to electrodes 22, 24 (and, therefore, substrate 12), and dissipates with distance from electrodes 22, 24. Preferably, the strength of the electric fields is substantially dissipated at a distance of about 25 mm from the exterior surface of substrate 12 proximate the corresponding sense area 26, 28. Voltage input may be increased if stronger fields are desired.

Integrated control circuits 18, 20 and associated resistors R1-R4 are configured so as to generate an electric field of predetermined strength about each electrode 22, 24. The detection circuits embodied in integrated control circuits 18, 20 sense and compare the strengths of the electric fields generated about inner and outer electrodes 22, 24. When an object or stimulus, for example, a user's fingertip or conductive mass, is proximate a sense area 26, the electric fields associated with the corresponding inner and outer electrodes 22, 24 are disturbed. (Preferably, the stimulus must be 25 mm or closer to the sense area 26 to disrupt the electric fields, given that the field strength preferably is substantially dissipated at greater distances.) Preferably, each integrated control circuit 18, 20 produces an output signal indicating a touch only when it senses that the disturbance to the electric field about the corresponding inner electrode 22 exceeds the disturbance to the electric field about the corresponding outer electrode 24 by a predetermined degree. This output signal is sent to controller C for further processing, as discussed further below.

Typically, contaminants and debris would affect the electric fields about both inner and outer electrodes 22, 24 equally. Because at least the foregoing threshold difference in field disturbance must be achieved in order for integrated control circuit 18, 20 to output a signal indicating an intentional touch, unintended responses causes by contaminants are minimized. Similarly, unintended responses resulting from stimuli proximate the periphery of sense area 26 disturbing the electric field about outer electrode 24 to a greater degree than the electric field about inner electrode 22 are minimized.

Electrode patterns 14, 16 are arranged such that the presence of a stimulus proximate one of primary sense areas 26 affects the field associated with the corresponding electrode pattern 14, 16, causing the corresponding integral control circuit 18, 20 to output a signal indicative of an intentional touch (a "touch signal"). The presence of an object proximate secondary sense area 28 affects the fields associated with the inner electrodes 22 of both of electrode patterns 14 and 16 to a greater degree than the electric fields associated with the corresponding outer electrodes 24, causing both integrated control circuits 18 and 20 to substantially simultaneously output a touch signal. Based on the touch signals it receives from integrated control circuits 18 and 20, controller C can determine which, if any, of sense areas 26, 28 is touched or otherwise stimulated at a given time. In response, controller C can generate a corresponding control signal. For example, controller C can generates a first control signal in response to a touch signal received only from integrated control circuit 18, a second control signal in response to a touch signal received only from integrated control circuit 20, and a third control signal in response to touch signals received substantially simultaneously from both integrated control circuits 18, 20. Thus, the present invention allows a controller to generate three distinct and specific control signals based on input received from only two sense electrode patterns 14, 16 and corresponding integrated control circuits 18, 20.

In a preferred embodiment, electrode patterns 14, 16 are configured so that primary sense areas 26 are sufficiently sized to receive a human fingertip. For example, primary sense area 26 may have a diameter of between about 8 mm and about 10 mm. Likewise, secondary sense area 28 is sufficiently sized to receive a fingertip. Inner electrodes 22 of first and second patterns 14, 16 are arranged so that a user's fingertip overlaps inner electrodes 22 associated with both of patterns 14, 16 when the fingertip is within secondary sense area 28. In other embodiments, sense areas 14, 16, can be sized as required by the specific application.

Various configurations and arrangements of electrode patterns 14, 16 may be provided depending on the particular application. Further, three or more electrode patterns may be configured such that at least two corresponding detection circuits may be simultaneously triggered when a stimulus is simultaneously proximate the corresponding secondary sense area defined by two or more of the electrode patterns. Various exemplary embodiments of shared electrode patterns will now be described.

Figure 4:
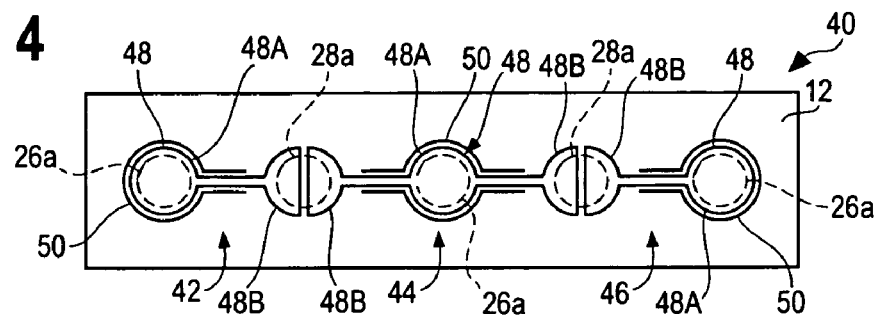
FIG. 4 is a plan view of a shared electrode pattern field effect sensor apparatus according to a second embodiment.

A shared sense electrode pattern touch sensor apparatus 40 according to a second embodiment of the present invention is best shown in FIG. 4. Apparatus 40 includes three linearly spaced electrode patterns 42, 44, 46 disposed on substrate 12. Each pattern 42, 44, 46 is electrically coupled to an associated pulse generation and detection circuit which preferably is embodied on an integrated control circuit (not shown), as described above. Each pattern 42, 44, 46 includes an inner electrode 48 and an outer electrode 50. An excitation signal is applied to each of inner and outer electrodes 48, 50, creating electric fields about each of inner and outer electrodes 48, 50, as described above.

Each inner electrode 48 includes a primary portion 48A which in essence defines a primary sense area, as shown by dashed lines 26a. Inner electrodes 48 of patterns 42, 46 also include one secondary portion 48B which in essence defines a portion of a secondary sense area. Inner electrode 48 of pattern 44 includes two secondary portions 48B, one of which is adjacent secondary portion 48B of electrode pattern 42 and the other of which is adjacent secondary portion 48B of electrode pattern 46. Adjacent secondary portions 48B define first and second secondary sense areas, as shown by dashed lines 28a.

Electrode patterns 42-46 and, therefore, primary and secondary sense areas 26a, 28a may be linearly arranged, as shown in the drawings. In other embodiments, the electrode patterns and sense areas may be configured non-linearly by, for example, modifying the geometry of the inner and outer electrodes, as would be recognized by one skilled in the art. Primary and secondary sense areas 26a, 28a should be sufficiently sized to receive a stimulus, for example, a human fingertip. When a stimulus is introduced proximate one of primary sense areas 26a, the electric field about primary portion 48A of inner electrode 48 of the corresponding electrode pattern 42, 44, 46 is disrupted, and the corresponding detection circuit outputs a touch signal, as described above. When a stimulus is introduced proximate one of secondary sense areas 28a, the electric fields about secondary portions 48B of inner electrodes 48 of corresponding electrode patterns 42, 44, 46 are disrupted, and both corresponding detection circuits output a touch signal, as described above.

As in the first embodiment described above, the detection circuit associated with each electrode pattern is electrically coupled to a controller (not shown), which may be disposed on substrate 12 or elsewhere. The controller generates a control signal based on the touch signals it receives from the detection circuits corresponding to electrode patterns 42, 44, 46, as discussed above. Thus, apparatus 40 provides five input points or sense areas (three primary and two secondary sense areas) using only three electrode patterns and three associated integrated control circuits. In a preferred embodiment, apparatus 40 is used as a digital slider control device having five command points or "levels" of gradation.

Figure 5:
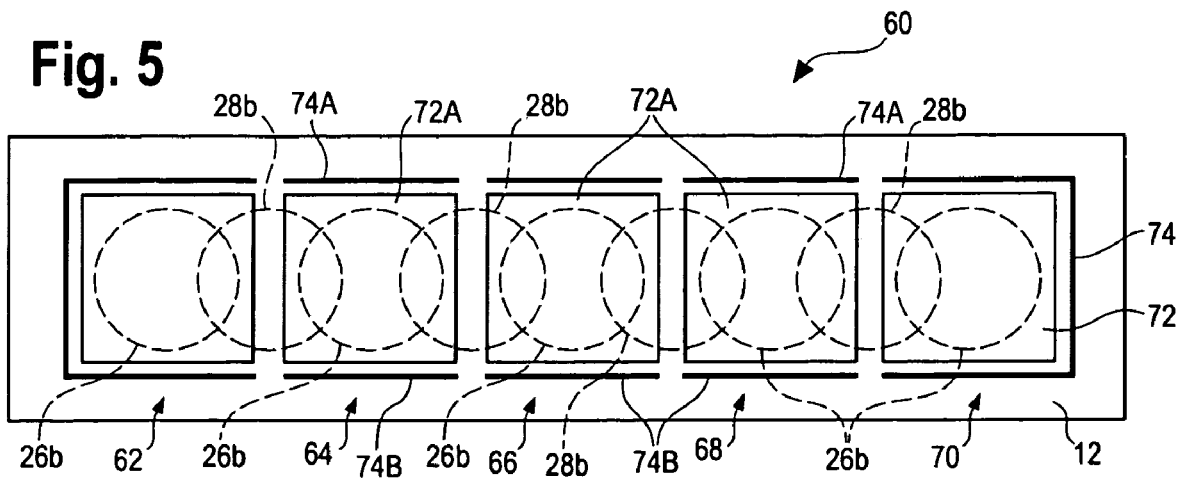
FIG. 5 is a plan view of a shared electrode pattern field effect sensor apparatus according to a third embodiment.

A shared sense electrode pattern touch sensor apparatus 60 according to a third embodiment is best shown in FIG. 5. Apparatus 60 includes five electrode patterns 62, 64, 66, 68, 70 disposed in a linear arrangement on substrate 12. In alternate embodiments, electrode patterns 62-70 could be arranged in a non-linear pattern, as discussed above. Each electrode pattern 62-70 is electrically coupled to an associated pulse generation and detection circuit which preferably is embodied on an integrated control circuit (not shown), as described above. Electrode patterns 62 and 70 are disposed at opposite ends of this linear arrangement. Each end pattern 62, 70 includes an inner electrode 72 and an outer electrode 74. Patterns 64, 66, 68 are disposed intermediate end patterns 62 and 70. Each intermediate pattern 64, 66, 68 includes an inner electrode 72A and first and second outer electrodes 74A, 74B. As in the other embodiments discussed above, excitation signals are applied to all inner and outer electrodes 72, 72A, 74, 74A, 74B, which create electric fields emanating therefrom. The fields preferably have the same polarity so that the fields repel each other, extending outwardly toward infinity.

Each inner electrode 72, 72A defines a primary sense area, as shown by dashed lines 26b. Adjacently disposed portions of inner electrodes 72, 72A define secondary sense areas, as shown by dashed lines 28b. For example, adjacent portions of inner electrode 72 of end pattern 62 and inner electrode 72A of intermediate pattern 64 define a first secondary sense area 28b, and adjacent portions of inner electrodes 72A of intermediate patterns 64, 66 define a second secondary sense area 28b. Thus, five primary sense areas 26b and four secondary sense areas 28b are provided.

Primary and secondary sense areas 26b, 28b should be sufficiently sized to receive the particular stimulus to be used to disturb the electric fields about sense areas 26b, 28b, for example, a human fingertip. When a stimulus is proximate one of primary sense areas 26b, the electric field emanating from the corresponding inner electrode 72, 72A is disturbed, thereby triggering the corresponding detection circuit. When a stimulus is proximate one of secondary sense areas 28b, the electric fields emanating from inner electrodes 72, 72A of the two corresponding electrode patterns 62-70 are disturbed, thereby triggering the two corresponding detection circuits.

As in the embodiments described above, the detection circuit associated with each electrode pattern is electrically coupled to a controller (not shown), which may be disposed on substrate 12 or elsewhere. The controller generates a control signal based on the touch signals it receives from the detection circuits, as discussed above. Thus, apparatus 60 provides nine input points using only five electrode patterns and five associated integrated control circuits. In a preferred embodiment, apparatus 60 is used as a digital slider control device having nine command points or "levels" of gradation.

Figure 6:
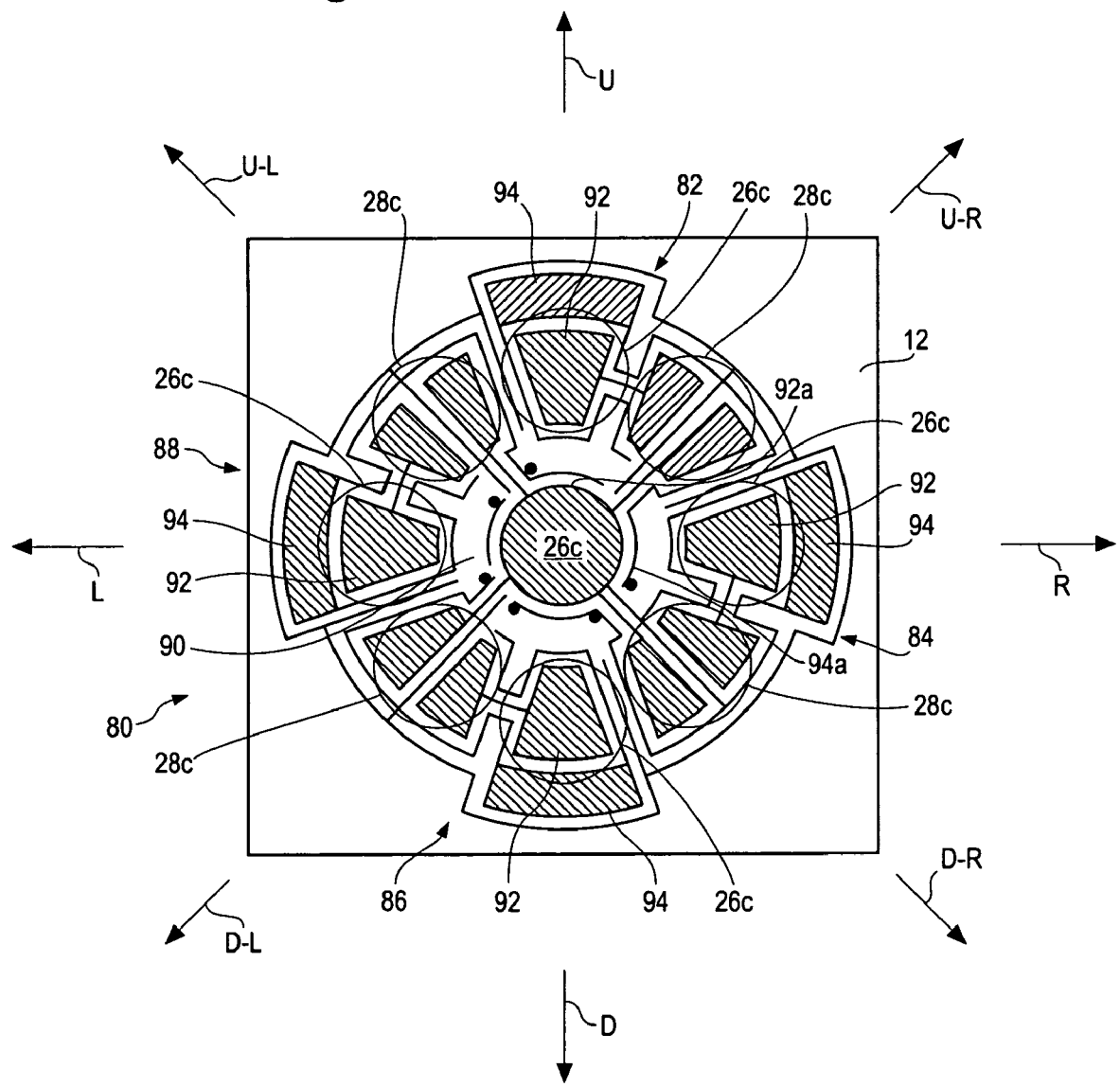
FIG. 6 is a plan view of a shared electrode pattern field effect sensor apparatus according to a fourth embodiment.

A shared sense electrode pattern touch sensor apparatus 80 according to a fourth embodiment is best shown in FIG. 6. Apparatus 80 includes four peripherally spaced electrode patterns 82, 84, 86, 88, and one central electrode pattern 90 disposed on substrate 12. Peripheral patterns 82-88 are arranged in a circular configuration, and central electrode 90 is provided in a center of the circular configuration.

Each peripheral pattern 82-88 includes an inner electrode 92 and an outer electrode 94. Each inner electrode 92 includes a primary portion in essence defining a primary sense area 26c, and a secondary portion in essence defining a portion of a secondary sense area. Outer electrodes 94 preferably are peripherally spaced around the circular configuration and radially aligned with a corresponding primary sense area 26c.

Central pattern 90 includes an inner electrode 92A having a primary portion defining a primary sense area 26c' and four secondary portions adjacent secondary portions of each of inner electrodes 82-88 to define four secondary sense areas 28c. Central pattern 90 also includes an outer electrode 94A proximate inner electrode 92A.

As in the other embodiments described above, each electrode pattern is coupled to a pulse generation circuit and a detection circuit, both of which preferably are embodied on a TS-100 ASIC or other integrated control circuit. An excitation signal is applied to all inner and outer electrodes 92, 92A, 94, 94A, creating electric fields emanating therefrom. The fields preferably have the same polarity so that the fields repel each other, extending outwardly toward infinity.

Primary sense areas 26c, 26c' are sufficiently sized to receive a stimulus, such as a fingertip. When a stimulus is proximate one of primary sense areas 26c or 26c', the electric field emanating from inner electrode 92 or 92A of the corresponding pattern 82-90 is disrupted, thereby causing the corresponding detection circuit to output a touch signal. When a stimulus is proximate one of secondary sense areas 28c, the electric fields emanating from adjacent inner electrodes 94, 94A of the corresponding one of peripheral patterns 82-88 and central pattern 90 are disrupted, thereby causing the two corresponding detection circuits to output touch signals.

Similar to the embodiments described above, the detection circuit associated with each electrode pattern is electrically coupled to a controller C', which may be disposed on substrate 12 or elsewhere. The controller generates a control signal based on the touch signals it receives from the detection circuits, as discussed above.

Figure 7:
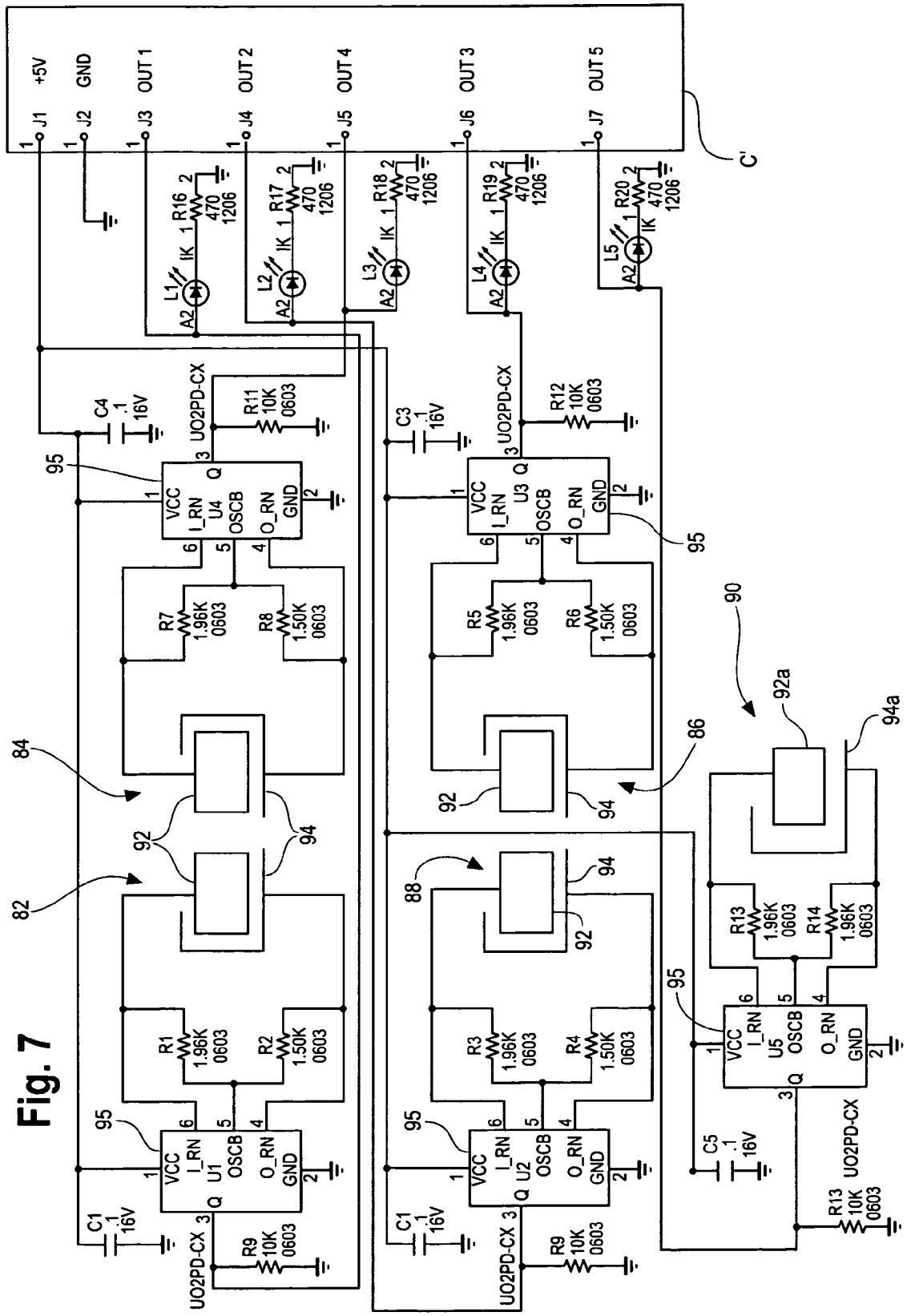
FIG. 7 is a schematic diagram illustrating the electrical connections among the components on the sensor substrate of the apparatus of FIG. 6.

Apparatus 80 may also include light-emitting diodes L1-L5 or other light sources disposed on substrate 12, as illustrated schematically in FIG. 7. Light-emitting diodes L1-L5 preferably are illuminated when the corresponding detection circuit outputs a touch signal.

In a preferred embodiment, apparatus 80 is a navigational control device for use with microprocessor C' having an associated display. Apparatus 80 preferably includes a base for housing the electrical components and electrodes of apparatus 80. Electrode patterns 82-90 and the associated components 95 may be provided on the back surface 12A of a transparent substrate 12, so that the opposing front surface 12B acts as the touch surface for a user. The touch surface may include graphical designs aligned with primary and secondary sense areas 26c, 26c', 28c. For example, directional arrows and a center button may be provided on the touch surface. Alternatively, a thin layer, such as a film, including such graphical designs may be adhered to the touch surface 12B.

Apparatus 80 can be used to provide directional control commands to, for example, move an object in a display in X-, Y-coordinates relative to the display. Referring to FIGS. 6 and 7, a touch (or other stimulus) proximate primary sense area 26c corresponding to electrode pattern 82 causes the corresponding detection circuit (embodied in corresponding integrated control circuit 95) to output a touch signal to controller C'. In response, controller C' generates a directional command for "up", as shown by arrow U. Similarly, touches proximate primary sense areas 26c corresponding to electrode pattern 84, 86, 88, cause the corresponding detection circuits to output touch signals to Controller C'. In response, controller C' generates directional commands for "right," "down," and "left," respectively, as shown by arrows R, D, and L, respectively.

Figure 8:
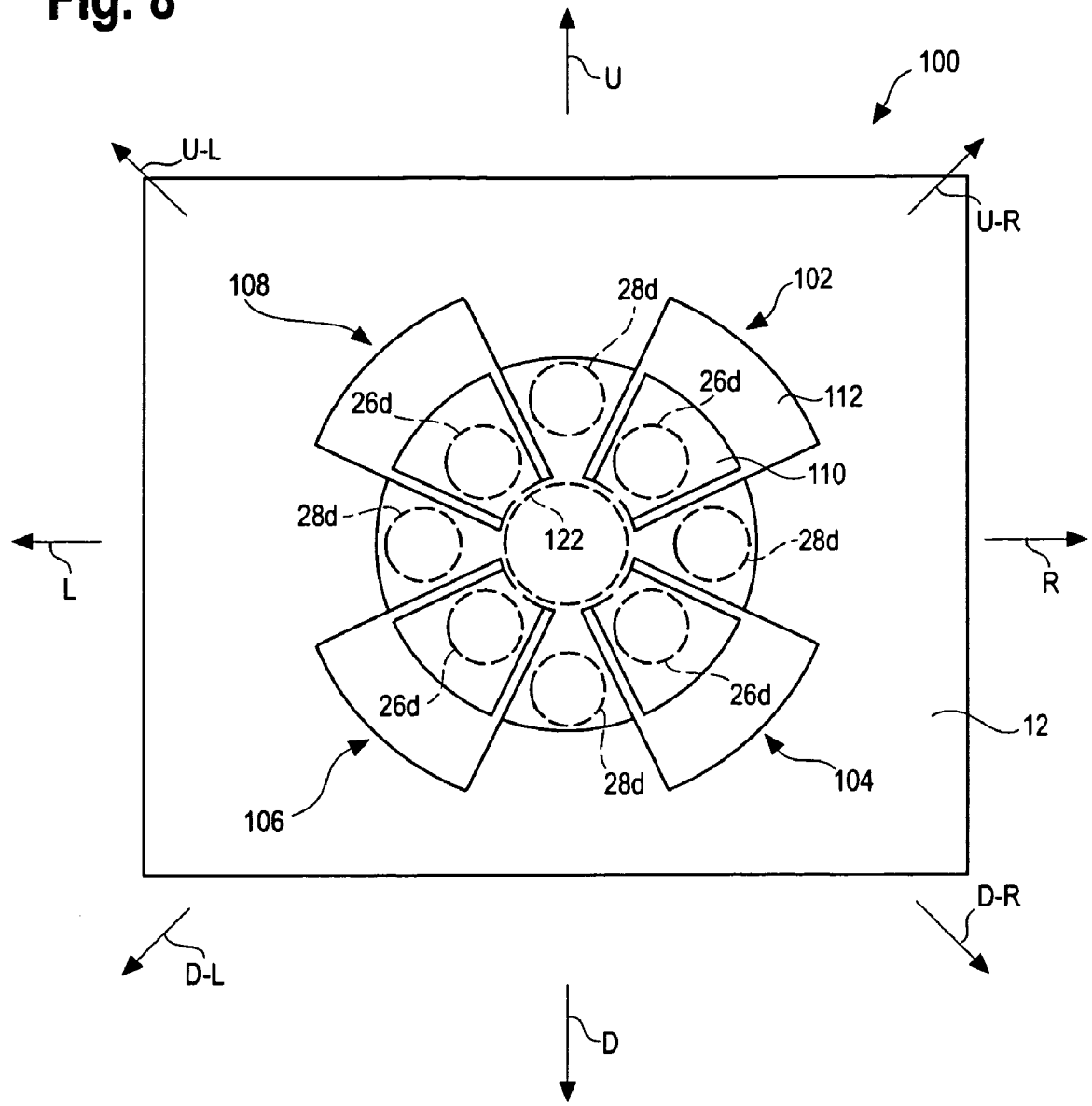
FIG. 8 is a plan view of a shared electrode pattern field effect sensor apparatus according to a fifth embodiment.

A touch proximate secondary sense area 28C corresponding to electrode patterns 82, 90 causes both corresponding detection circuits to output touch signals to Controller C'. In response, controller C' generates a directional command for "diagonally up and to the right", as shown by arrow U-R. Similarly, touches proximate secondary sense areas 28c corresponding to electrode patterns 84, 90, electrode patterns 86, 90, and electrode patterns 88, 90, will, respectively, cause controller C' to generate directional commands for "diagonally down and to the right," as shown by arrow D-R, diagonally down and to the left," as shown by arrow D-L, and "diagonally up and to the left," as shown by arrow U-L. A touch proximate sense area 26c' will cause only the detection circuit corresponding to center electrode pattern 90 to output a touch signal, which controller C' may interpret as a command to, for example, start or stop movement. A shared sense electrode pattern touch sensor apparatus 100 according to a fifth embodiment is best shown in FIG. 8. Apparatus 100 includes four peripherally spaced electrode patterns 102, 104, 106, 108 disposed on substrate 12 and arranged in a circular configuration. Each pattern 102-108 is electrically coupled to a pulse generation circuit and a detection circuit which preferably are embodied as a TS-100 ASIC or other integrated control circuit, as described above and as best shown in FIG. 9.

Each pattern 102-108 includes an inner electrode 110 and an outer electrode 112. As best shown in FIG. 10, each inner electrode 110 includes a primary portion 114, first and second side portions 116, 118, and a center portion 120. Each outer electrode 112 is peripherally spaced around the circular configuration, and radially aligned with a corresponding primary portion 114, as best shown in FIG. 8.

Inner electrodes 110 are arranged such that first side portion 116 of one of patterns 102-108 is adjacent second side portion 118 of another of patterns 102-108. Center portions 120 from each of patterns 102-108 are disposed in a center portion of the circular configuration. Primary portions 114 define a primary sense area, as shown by dashed circles 26d. Each pair of adjacent side portions 116, 118 define a secondary sense area, as shown by dashed circles 28d. The center portion defines a tertiary sense area, as shown by dashed circle 122. Each sense area 26d, 28d, 122 is sufficiently sized to receive a stimulus, such as a human fingertip.

The output of each detection circuit preferably is coupled to a controller C", as best shown in FIG. 9. Controller C" generates an output signal as a function of the touch signals it receives from the various detection circuits. Apparatus 100 may also include light-emitting diodes, such as provided in the fourth embodiment.

In a preferred embodiment, apparatus 100 is a navigational control device for use with a microprocessor C" having an associated display. Apparatus 100 preferably includes a base for housing the electrical components and a substrate 12 having directional arrows and a center button on the touch surface, as described above.

Nine command points are provided using four electrode patterns and four components, as best shown in FIGS. 8 and 9. Control commands providing directional information may then move an object in X-, Y-coordinates relative to the display, or change the orientation of images on the display. Because each inner electrode 110 includes center portion 120, a separate centrally disposed electrode pattern is not required, such as provided in the fourth embodiment.

Referring to FIG. 8, a user's finger or other stimulus proximate one of secondary sense areas 28d causes both corresponding detection circuits to output touch signals to controller C". In response, controller C" generates a corresponding directional command for "up", "right", "down", or "left", as shown by arrows U, R, D, L, respectively. A user's finger proximate one of primary sense areas 26d causes only the one corresponding detection circuit to output a touch signal to controller C". In response, controller C" generates a corresponding directional command for "diagonally up and to the right", "diagonally down and to the right", "diagonally down and to the left", and "diagonally up and to the left", as shown by arrows U-R, D-R, D-L, U-L, respectively. A user's finger proximate tertiary sense area 122 causes the detection circuits corresponding to all four electrode patterns to output a touch signal to controller C". In response, controller C' generates a command to, for example, "start movement" or "stop movement."

It should be understood that the embodiments disclosed herein are exemplary only, and the present invention is not so limited. The present invention may be used for various other applications. Further, various control signals may be generated by an associated controller. In addition, aspects of one of the embodiments may be incorporated into another of the embodiments. The shared electrode patterns of the present invention allow for a reduction in the number of components required for multiple sense points, thereby decreasing manufacturing costs. Furthermore, the present invention provides for increased functionality for applications having limited space.

Thus, various modifications and configurations of the present invention may be made without departing from the scope or spirit of the present invention. For example, a shared electrode pattern may include an inner electrode having more than three secondary portions. Accordingly, the present invention is intended to include all such modifications and variations, provided they come within the scope of the following claims and their equivalents.

I claim:

1. A shared electrode pattern field effect touch sensor apparatus, comprising:
   a dielectric substrate;
   at least first and second spaced electrode patterns disposed on said substrate, each of said patterns having an inner electrode and an outer electrode, said inner electrode including a primary portion defining a primary sense area and at least one secondary portion, said secondary portions of said first and second patterns adjacently disposed and defining a secondary sense area;
   at least first and second integrated control circuits (ICCs) disposed on said substrate, each of said ICCs electrically coupled to a corresponding one of said patterns, said inner and outer electrodes arranged such that the presence of an object proximate one of said primary sense areas causes the corresponding one of said ICCs to output a touch signal, and the presence of an object proximate said secondary sense area causes each of said ICCs to output a touch signal; and
   a controller in communication with said first and second ICCs, said controller adapted to receive said touch signals and to output a control signal indicative of the presence at said controller of a touch signal output by said first ICC, a touch signal output by said second ICC or touch signals output by each of said first and second ICCs.

2. The touch sensor apparatus of claim 1, wherein each of said ICCs is electrically coupled to the corresponding electrodes via an oscillator signal line.

3. The touch sensor apparatus of claim 2, wherein a strobe signal is applied to each of said oscillator lines for energizing said electrodes such that an electric field emanates from each of said inner and outer electrodes.

4. The touch sensor apparatus of claim 3, wherein each of said ICCs senses disturbances in said electric fields corresponding thereto, each of said ICCs outputting a touch signal if a threshold difference in strength between said corresponding electric fields associated with said inner electrode and said outer electrode is sensed.

5. The touch sensor apparatus of claim 1, wherein the apparatus includes a third electrode pattern disposed on said substrate and spaced from said first and second patterns and a third ICC electrically coupled to said third electrode pattern.

6. The touch sensor apparatus of claim 5, wherein the apparatus includes at least a fourth electrode pattern disposed on said substrate and spaced from said first, second and third patterns and a fourth ICC electrically coupled to said fourth electrode pattern.

7. The touch sensor apparatus of claim 6, wherein said inner electrode of each of said patterns includes first, second and third secondary portions.

8. The touch sensor apparatus of claim 7, wherein each secondary portion of one of said patterns is adjacent a corresponding secondary portion of another of said patterns.

9. The touch sensor apparatus of claim 8, wherein said patterns are arranged in a circular configuration on said substrate.

10. The touch sensor apparatus of claim 9, wherein said first secondary portion of one of said patterns is adjacent said first secondary portion of another of said patterns and wherein said second secondary portion of one of said patterns is adjacent said second secondary portion of another of said patterns, each of said pairs of adjacent secondary portions defining a corresponding secondary sense area.

11. The touch sensor apparatus of claim 10, wherein each of the ICCs corresponding to one of said secondary sense areas outputs a touch signal when an object is proximate said one of said secondary sense areas.

12. The touch sensor apparatus of claim 11, wherein each of said third secondary portions is disposed in a center portion of said circular configuration, said third secondary portions collectively defining a tertiary sense area.

13. The touch sensor apparatus of claim 12, wherein each of the ICCs corresponding to said tertiary sense area outputs a touch signal when an object is proximate said tertiary sense area.

14. The touch sensor apparatus of claim 13, wherein the apparatus is a navigational control device for use with a microprocessor and operably associated display.

15. The touch sensor apparatus of claim 14, wherein in response to a touch signal received from one of said ICCs, said controller generates a control signal for causing movement of an image displayed on the display in one of an "up", "right", "down" and "left" direction.

16. The touch sensor apparatus of claim 15, wherein in response to touch signals received from two of said ICCs, said controller generates a control signal for causing movement of the image displayed on the display in one of a "diagonally up and to the right", "diagonally down and to the right", "diagonally down and to the left", and "diagonally up and to the left" direction.

17. The touch sensor apparatus of claim 16, wherein in response to touch signals received from each of said ICCs, said controller generates a control signal for starting or stopping movement of the image displayed on the display.

18. The touch sensor apparatus of claim 6, wherein the apparatus includes at least a fifth sense electrode pattern disposed on said substrate and spaced from said first, second, third and fourth patterns and a fifth ICC electrically coupled to said fifth electrode pattern.

19. The touch sensor apparatus of claim 18, wherein each of at least three of said patterns includes first and second secondary portions, each of said secondary portions of one of said patterns being adjacent a corresponding secondary portion of another of said patterns, each pair of adjacent secondary portions defining a corresponding secondary sense area.

20. The touch sensor apparatus of claim 19, wherein the presence of an object proximate one of the secondary sense areas causes each of the ICCs corresponding to the secondary sense area to output a touch signal.

21. The touch sensor apparatus of claim 20, wherein in response to the touch signals output by said ICCs, said controller generates a specific control signal.

22. The touch sensor apparatus of claim 21, wherein said first, second, third and fourth patterns are arranged in a circular configuration.

23. The touch sensor apparatus of claim 19, wherein said fifth pattern includes four secondary portions, each of said fifth pattern secondary portions being adjacent a corresponding secondary portion of another of said patterns, each pair of adjacent secondary portions defining a corresponding secondary sense area.

24. The touch sensor apparatus of claim 23, wherein said fifth pattern primary portion is disposed in a center portion of said circular configuration.

25. The touch sensor apparatus of claim 24, wherein the apparatus is a navigational control device for use with a microprocessor and operably associated display.

26. The touch sensor apparatus of claim 25, wherein in response to touch signals received from one of said ICCs associated with one of said first, second, third and fourth patterns, said controller generates a control signal for causing movement of an image displayed on the display in one of an "up", "right", "down" and "left" direction.

27. The touch sensor apparatus of claim 26, wherein in response to touch signals received from two of said ICCs, said controller generates a control signal for causing movement of the image displayed on the display in one of a "diagonally up and to the right", "diagonally down and to the right", "diagonally down and to the left", and "diagonally up and to the left" direction.

28. The touch sensor apparatus of claim 27, wherein in response to a touch signal received from said fifth ICC, said controller generates a control signal for starting or stopping movement of the image displayed on the display.

29. The touch sensor apparatus of claim 18, wherein said all of said primary sense areas and said secondary sense areas are substantially collinear.

30. The touch sensor apparatus of claim 5, wherein the third electrode pattern includes a primary portion and a secondary portion, said third pattern primary portion defining a primary sense area, and wherein the second electrode pattern further includes a second secondary portion, said second secondary portion and said third pattern secondary portion defining a second secondary sense area, wherein the presence of an object proximate the third pattern primary sense area causes the third ICC to output a touch signal and the presence of an object proximate the second secondary sense area causes each of the third ICC and the ICC corresponding to the second pattern to output a touch signal, and wherein the controller further is adapted to receive a touch signal from said third ICC and to output a control signal indicative of the presence of a touch signal output by said third ICC or touch signals output by each of said third ICC and said ICC corresponding to the second pattern.

31. The touch sensor apparatus of claim 30, wherein said first, second and third pattern primary sense areas and said first and second secondary sense areas are substantially collinear.

32. The touch sensor apparatus of claim 30, wherein said first, second and third patterns are substantially collinear.

33. The touch sensor apparatus of claim 1, wherein said first and second pattern primary sense areas and said secondary sense area are substantially collinear.

34. A navigational control device for transmitting direction information to an associated microprocessor operably associated with a display, comprising:

a base formed from a dielectric material;

a plurality of spaced inner electrodes disposed on said base and arranged in a circular configuration, each of said inner electrodes having a primary portion and at least one side portion, said side portions of at least two of said inner electrodes adjacently disposed;

a plurality of spaced outer electrodes disposed on said base, each of said outer electrodes associated with one of said inner electrodes, said outer electrode proximate said primary portion;

a signal line for providing electrical signals to each of said inner and outer electrodes, wherein an electric field is generated from each of said inner and outer electrodes in response to the signals provided thereto, said inner and outer electrodes arranged such that the presence of an object proximate said primary portion affects the electric field of the corresponding one inner electrode, and an object proximate said adjacent side portions affects the electric fields of the corresponding at least two inner electrodes;

a plurality of detection circuits disposed on said base, each of said detection circuits electrically coupled to a corresponding associated inner and outer electrodes, wherein one of said detection circuits is activated when the electric field from said primary portion is affected and at least two of said detection circuits are activated when the electric field from said adjacent side portions is affected; and a controller in communication with said detection circuits, said controller sensing activation of said detection circuits and generating a control signal in response to the sensed activation, said controller having an output for transmitting the control signal to the associated microprocessor.

35. The navigational control device of claim 34, wherein the control device includes four circumferentially spaced inner electrodes, each of said inner electrodes having at least two side portions, said primary portion intermediate said side portions.

36. The navigational control device of claim 35, wherein said side portion of one of said inner electrodes is adjacent a corresponding side portion of another of said inner electrodes.

37. The navigational control device of claim 36, wherein each of said inner electrodes further comprises a central portion disposed in a middle portion of said circular configuration, wherein the corresponding electric field of each of said inner electrodes is affected when an object is proximate said central portion, thereby activating all of the corresponding detection circuits.

38. The navigational control device of claim 34, wherein the control device includes four circumferentially spaced inner electrodes and a fifth inner electrode disposed in a center portion of said circular configuration.

39. The navigational control device of claim 38, wherein each of said circumferentially spaced inner electrodes includes one side portion.

40. The navigational control device of claim 39, wherein said fifth inner electrode includes four side portions, each of said fifth inner electrode side portions adjacent said side portion of one of said circumferentially spaced inner electrodes.

41. A method of processing touch sensor field effect signals, comprising the steps of:
providing a dielectric substrate;
providing at least first and second spaced sense electrode patterns disposed on the substrate, each of the patterns having an inner electrode and an outer electrode, the inner electrode including a primary portion defining a primary sense area and at least one secondary portion, the secondary portions of the first and second patterns adjacently disposed and defining a secondary sense area;
applying a signal to each of the inner and outer electrodes such that an electric field emanates from each of the electrodes; and
positioning a stimulus proximate the secondary sense area and thereby simultaneously altering the electric fields associated with the first and second patterns.

42. The method of claim 41, including the further steps of:
providing at least first and second detection circuits disposed on the substrate, each of the patterns electrically coupled to a corresponding one of the detection circuits; and
simultaneously activating both of the detection circuits when the electric fields are altered during said positioning step.

43. The method of claim 42, including the further steps of:
transmitting a command signal from each of the activated detection circuits to a remote device; and
generating a control signal in response to the command signal.

44. A shared electrode pattern field effect touch sensor apparatus, comprising:
a dielectric substrate;
at least first and second spaced electrode patterns disposed on said substrate, each of said patterns having an inner electrode and an outer electrode, each of said inner electrodes of said first and second patterns defining a primary sense area and adjacent portions of said inner electrodes of said first and second patterns defining a first secondary sense area;
at least first and second integrated control circuits (ICCs) disposed on said substrate, each of said ICCs electrically coupled to a corresponding one of said patterns, said inner and outer electrodes arranged such that the presence of an object proximate one of said primary sense areas causes the corresponding one of said ICCs to output a touch signal, and the presence of an object proximate said secondary sense area causes each of said ICCs to output a touch signal; and
a controller in communication with said first and second ICCs, said controller adapted to receive said touch signals and to output a control signal indicative of the presence at said controller of a touch signal output by said first ICC, a touch signal output by said second ICC or touch signals output by each of said first and second ICCs.

45. The touch sensor apparatus of claim 44 further comprising:
a third electrode pattern disposed on said substrate, said third pattern having an inner electrode and an outer electrode, said inner electrodes of said third pattern defining a primary sense area and said inner electrodes of said second and third patterns collectively defining a second secondary sense area; and
a third ICC disposed on said substrate, said third ICC electrically coupled to said third pattern, said inner and outer electrodes of said third pattern arranged such that the presence of an object proximate said third pattern primary sense area causes said third ICC to output a touch signal, and the presence of an object proximate said second secondary sense area causes each of said second and third ICCs to output a touch signal;
wherein said controller further is adapted to receive touch signals from said third ICC and to output a control signal indicative of the presence at said controller of a touch signal output by said third ICC or touch signals output by each of said second and third ICCs.

46. The touch sensor apparatus of claim 45 wherein said first, second, and third pattern primary sense areas and said first and second secondary sense are substantially collinear.

* * * * *